United States Patent
Bartell et al.

(10) Patent No.: US 7,283,359 B2
(45) Date of Patent: Oct. 16, 2007

(54) METHOD AND APPARATUS FOR ACOUSTIC NOISE REDUCTION IN A COMPUTER SYSTEM HAVING A VENTED COVER

(75) Inventors: Richard Charles Bartell, West Hartford, CT (US); Gerard Francis Muenkel, Raleigh, NC (US); Matthew A. Nobile, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 11/304,132

(22) Filed: Dec. 15, 2005

(65) Prior Publication Data

US 2007/0139882 A1    Jun. 21, 2007

(51) Int. Cl.
*H05K 7/20* (2006.01)
(52) U.S. Cl. ...................... 361/695; 454/184
(58) Field of Classification Search .............. 361/695, 361/721; 454/184
See application file for complete search history.

(56) References Cited

U.S. PATENT DOCUMENTS

| | | | |
|---|---|---|---|
| 5,526,228 | A | 6/1996 | Dickson et al. |
| 6,819,563 | B1 | 11/2004 | Chu et al. |
| 2004/0100770 | A1 | 5/2004 | Chu et al. |

*Primary Examiner*—Javaid H. Nasri
(74) *Attorney, Agent, or Firm*—Matthew J. Bussan (57) ABSTRACT

A vented cover includes a pair of cross-flow ventilation ducts each including an acoustic noise reduction lining. The ducts are "cross-flow" in that they cross and bypass one another. The cover is affixed to an enclosure containing components of a computer system and abuts against a panel of the enclosure having an airflow aperture. An air moving device (AMD) passes air through the enclosure from the ducts if the cover is an intake cover, and/or into the ducts if the cover is an exhaust cover. The ducts increase the air path length, and the acoustic absorbing surface, thereby increasing acoustic attenuation. Airflow resistance is reduced by reducing surfaces perpendicular and close to the area where air enters and by reducing sharp turns in the ducts. The cover has a relatively thin depth because the ducts cross and bypass each other in a very space efficient manner.

6 Claims, 9 Drawing Sheets

METHOD AND APPARATUS FOR ACOUSTIC NOISE REDUCTION IN A COMPUTER SYSTEM HAVING A VENTED COVER

BACKGROUND OF THE INVENTION

1. Field of Invention

The present invention relates in general to housings for enclosing computer systems and in particular to vented covers with acoustic attenuation for use with such housings. Still more particularly, the present invention relates to a computer system which includes a vented cover having cross-flow ventilation ducts with an acoustic noise reduction lining.

2. Background Art

Computer systems are using larger amounts of energy, and are generating more heat. Increased heat generation is driven by factors such as increases in processor performance and clock speed, and increases in the number of devices per integrated circuit. Electronic components, such as microprocessors and integrated circuits, must operate within certain specific temperature ranges to perform efficiently. Excessive heat degrades electronic component performance, reliability, life expectancy, and can even cause failure. Air moving devices (AMDs), such as fans and blowers, are widely used for controlling excessive heat. AMDs are often used in combination with heat sinks thermally connected to electronic components to be cooled. Typically, heat sinks are formed with fins to increase the surface area of the heat sink and thereby enhance heat dissipation as air moved by an AMD passes over the heat sink.

In many large server applications, the processors of a computer system along with their associated electronics (e.g., memory, disk drives, power supplies, etc.) are packaged in removable drawer configurations stacked within a rack or frame. In other cases, the processors of a computer system along with their associated electronics may be in fixed locations within the rack or frame. Typically, the components are cooled by air moving in parallel air flow paths, usually front-to-back, impelled by one or more AMDs.

With the advent of the increased heat generated by computer systems, increased ventilation is required to move cooling air through the computer system. A failure to provide adequate ventilation through a computer system may increase the probability of computer failure due to overheating and may result in damage to the electronic components. Due to the great expense of these electronic components and the concomitant loss of processing time associated with such failures, it is desirable that adequate ventilation be maintained for computer systems. Increased air flow rates are needed to provide adequate ventilation. However, the acoustic noise associated with the increased air flow rates required to provide adequate ventilation, as well as acoustic noise generated by the various components within the computer system, represents a problem that must be overcome. There are limits on the acoustic output of computer systems (e.g., servers and storage products) set by vendors, governments, standards setting bodies, and the like.

Figure 1:
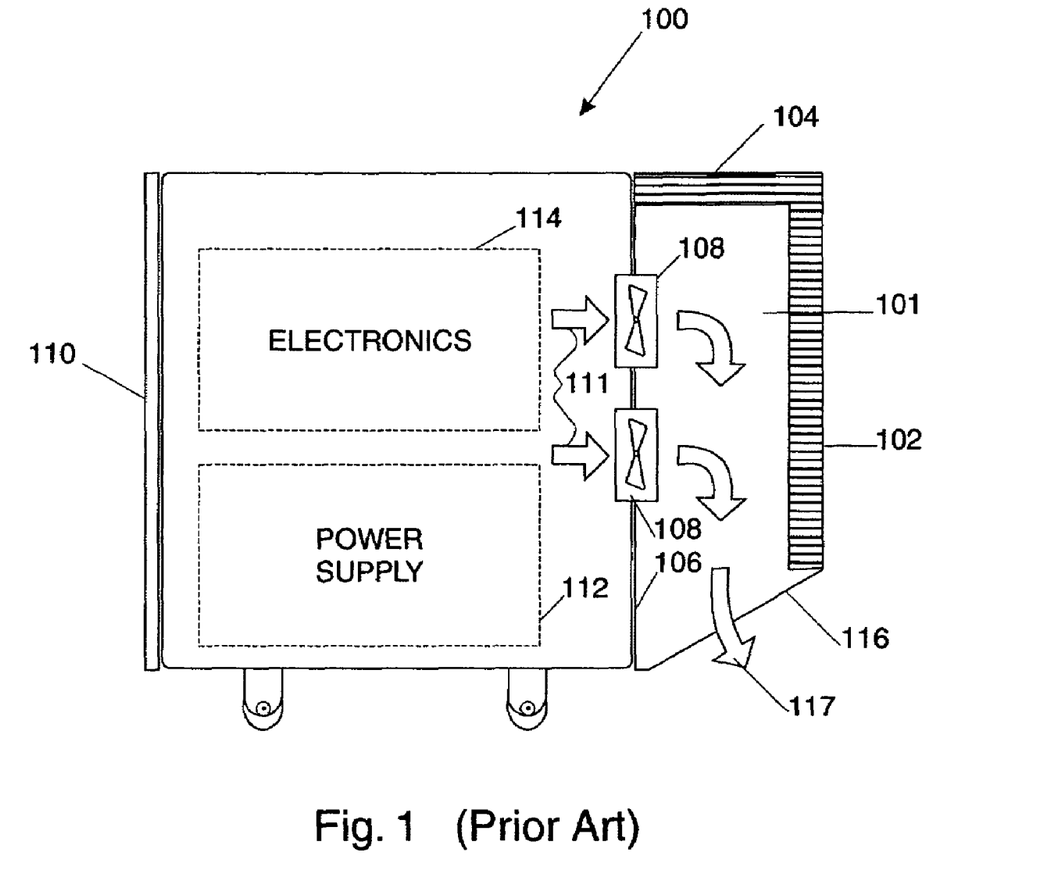
FIG. 1 is a sectional, partly schematic side view of a computer system incorporating an acoustic dampening cooling fan shroud panel, as known in the art.

In order to reduce acoustic noise, it is known to utilize an acoustic noise reduction lining in vented covers of computer systems. An example of such an arrangement is found in U.S. Pat. No. 5,526,228, issued Jun. 11, 1996 to Dickson et al., entitled "COMPUTER SYSTEM UNIT WITH ACOUSTIC DAMPENING COOLING FAN SHROUD PANEL", which is assigned to the assignee of the present application. As shown in FIG. 1, a cooling fan shroud panel 101 includes an acoustic noise reduction lining comprising a side acoustic foam panel 102 and a top acoustic foam panel 104. The acoustic dampening cooling fan shroud panel 101 is mounted to an intermediate rear panel 106 of a computer system unit 100. Two cooling fans 108 are mounted within fan mounting apertures of the intermediate rear panel 106. The cooling fans 108 draw air through computer system unit 100 from an intake ventilation grill (not shown) of a front panel 110 in the direction indicated by the arrows designated with reference numeral 111. Mounted within computer system unit 100 are a power supply 112 and an electronic component package 114, which are cooled by the air drawn through computer system unit 100. Air is directed out an exiting ventilation aperture 116 of cooling fan shroud panel 101 in the direction indicated by the arrow designated with reference numeral 117. The exiting ventilation aperture 116 is displaced from the mounting position of the cooling fans 108 such that acoustic noise resultant from the cooling fan operation is diminished. Even though acoustic dampening cooling fan shroud 101 is effective in diminishing acoustic noise, it exhibits a number of disadvantages. First, the relatively substantial depth of acoustic dampening cooling fan shroud panel 101 significantly increases the footprint of computer system unit 100. Second, the small area of exiting ventilation aperture 116 relative to intermediate rear panel 106 reduces the cooling efficiency.

Figure 2:
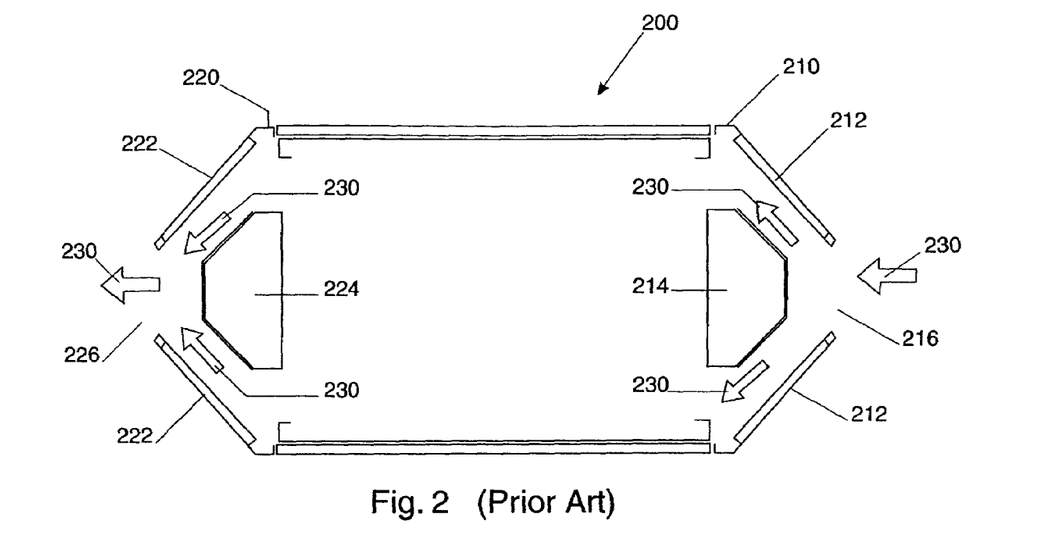
FIG. 2 is a sectional, top view of a computer system enclosure incorporating vented covers each with an acoustic noise reduction lining that includes two outer acoustic foam panels and a central acoustic foam block, as known in the art.

FIGS. 2 and 3 show other examples of the utilization of acoustic noise reduction lining in vented covers found in the IBM eServer zSeries 900 server. As shown in FIG. 2 (Top View), an inlet cover 210 includes an acoustic noise reduction lining comprising two outer acoustic foam panels 212 and central acoustic foam block 214. An inlet ventilation aperture 216 is defined between outer acoustic foam panels 212. Similarly, an exhaust cover 220 includes an acoustic noise reduction lining comprising two outer acoustic foam panels 222 and central acoustic foam block 224. An exhaust ventilation aperture 226 is defined between outer acoustic foam panels 222. The inlet cover 210 and the exhaust cover 220 are mounted to a computer system frame or rack 200 using hinges (not shown) so that removable drawers (not shown) stacked within computer system frame 200 may be accessed when inlet cover 210 and/or exhaust cover 220 is/are swung open via the hinges. AMDs (not shown) draw air through computer system frame 200 from inlet ventilation aperture 216 and exhaust the air through exhaust ventilation aperture 226. The air moves in the direction indicated by arrows designated by reference numeral 230. The removable drawers, which contain processors and their associated electronics, are cooled by the air drawn through computer system frame 200, as are electronic components fixed within computer system frame 200. Acoustic noise resultant from the AMD operation is effectively diminished by inlet cover 210 and exhaust cover 220 which have three main attributes: a large amount of acoustic absorbing material; an air/noise path that curves or angles to force sound to impact the acoustic lining; and minimum sharp bends in the air path to minimize airflow resistance. Even though inlet cover 210 and exhaust cover 220 are effective in diminishing acoustic noise, they exhibit a number of disadvantages. First, the relatively substantial depth of inlet cover 210 and exhaust cover 220 significantly increase the footprint of computer system frame 200. Second, the central acoustic foam block 224 in the exhaust cover 220 reduces cooling efficiency because it acts as a roadblock to exiting air. Third, inlet cover 210 and exhaust cover 220 cannot be made much more efficient without increasing airflow resistance, or increasing the cover depth (i.e., there are practical limits on how deep inlet cover 210 and exhaust cover 220 can be while still allowing the hinges to open).

Figure 3:
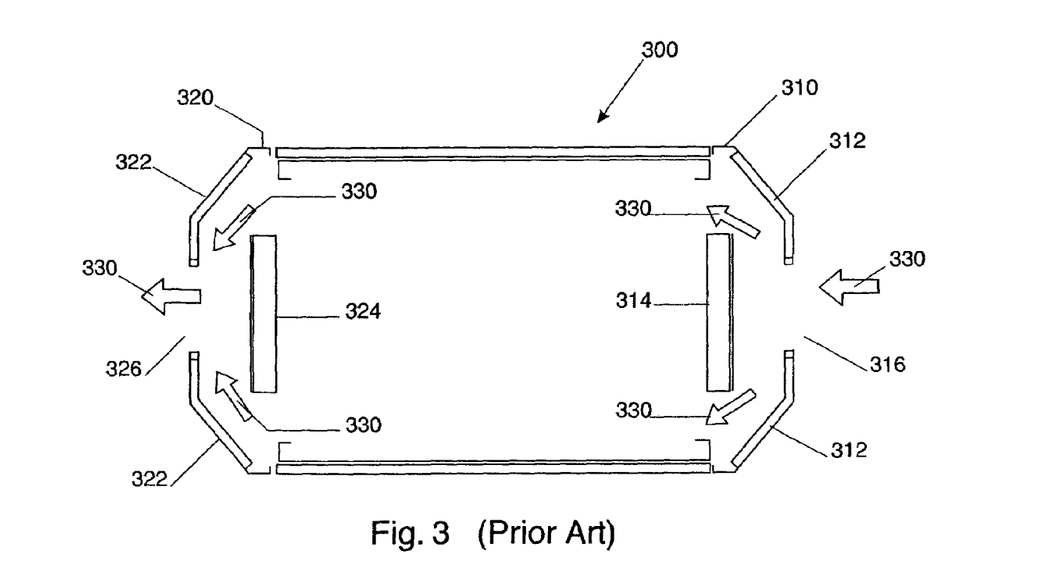
FIG. 3 is a sectional, top view of a computer system enclosure incorporating vented covers each with an acoustic noise reduction lining that includes two angled outer acoustic foam panels and a central acoustic foam panel, as known in the art.

FIG. 3 shows a modification of the configuration of inlet and outlet covers shown in FIG. 2 to reduce increase in the footprint of the computer system frame. As shown in FIG. 3, an inlet cover 310 includes an acoustic noise reduction lining comprising two angled outer acoustic foam panels 312 and central acoustic foam panel 314. An inlet ventilation aperture 316 is defined between angled outer acoustic foam panels 312. Similarly, an exhaust cover 320 includes an acoustic noise reduction lining comprising two angled outer acoustic foam panels 322 and central acoustic foam panel 324. An exhaust ventilation aperture 326 is defined between angled outer acoustic foam panels 322. The inlet cover 310 and the exhaust cover 320 are mounted to a computer system frame or rack 300 using hinges (not shown) so that removable drawers (not shown) stacked within computer system frame 300 may be accessed when inlet cover 310 and/or exhaust cover 320 is/are swung open via the hinges. AMDs (not shown) draw air through computer system frame 300 from inlet ventilation aperture 316 and exhaust the air through exhaust ventilation aperture 326. The air moves in the direction indicated by arrows designated by reference numeral 330. The removable drawers, which contain processors and their associated electronics, are cooled by the air drawn through computer system frame 300, as are electronic components fixed within computer system frame 300. As with the configuration shown in FIG. 2, acoustic noise resultant from the AMD operation is effectively diminished by inlet cover 310 and exhaust cover 320, but with a reduced footprint relative to the configuration shown in FIG. 2. Even though inlet cover 310 and exhaust cover 320 are effective in diminishing acoustic noise with a reduced footprint, these covers exhibit all of the other of disadvantages of the configuration shown in FIG. 2.

It should therefore be apparent that a need exists for a computer system enclosure which can both adequately ventilate a computer system housed therein and reduce the amount of acoustic noise, while addressing the disadvantages of the prior art.

SUMMARY OF THE INVENTION

According to the preferred embodiments of the present invention, a vented cover includes a pair of cross-flow ventilation ducts each including an acoustic noise reduction lining. The ventilation ducts are "cross-flow" in that they cross and bypass one another. The vented cover is affixed to an enclosure containing components of a computer system and abuts against a panel of the enclosure having an airflow aperture. An air moving device (AMD) passes air through the enclosure from the cross-flow ventilation ducts in the case where the vented cover is an intake ventilation cover, and/or into the cross-flow ventilation ducts in the case where the vented cover is an exhaust ventilation cover. The cross-flow ventilation ducts increase the air path length, along with the acoustic absorbing surface, thereby increasing acoustic attenuation. Airflow resistance is reduced by reducing surfaces perpendicular and close to the area where air enters and by reducing sharp turns in the ducts. The vented cover has a relatively thin depth because the cross-flow ventilation ducts cross and bypass each other in a very space efficient manner.

The foregoing and other features and advantages of the present invention will be apparent from the following more particular description of the preferred embodiments of the present invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS 1.0 Overview

In accordance with the preferred embodiments of the present invention, a vented cover can include a pair of cross-flow ventilation ducts or a series of paired cross-flow ventilation ducts each including an acoustic noise reduction lining. The ventilation ducts are "cross-flow" in that they cross and bypass one another. The vented cover is affixed to an enclosure containing components of a computer system and abuts against a panel of the enclosure having an airflow aperture. An air moving device (AMD) passes air through the enclosure from the cross-flow ventilation ducts in the case where the vented cover is an intake ventilation cover, and/or into the cross-flow ventilation ducts in the case where the vented cover is an exhaust ventilation cover. The cross-flow ventilation ducts increase the air path length, along with the acoustic absorbing surface, thereby increasing acoustic attenuation. Airflow resistance is reduced by reducing surfaces perpendicular and close to the area where air enters and by reducing sharp turns in the ducts. The vented cover has a relatively thin depth because the cross-flow ventilation ducts cross and bypass each other in a very space efficient manner.

2.0 Detailed Description

Figure 4:
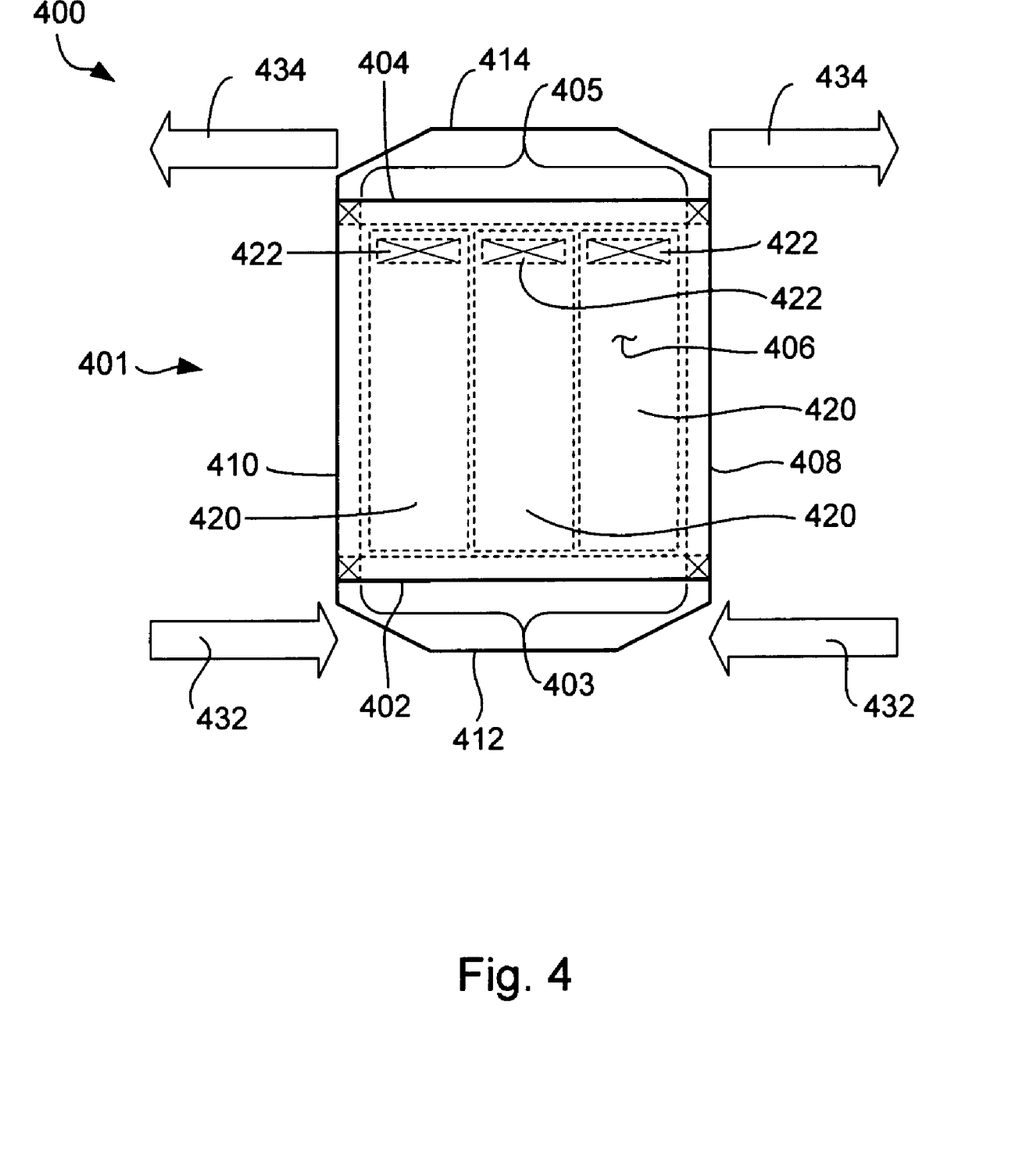
FIG. 4 is a top view of a computer system incorporating vented covers having cross-flow ventilation ducts with an acoustic noise reduction lining according to the preferred embodiments of the present invention.

With reference to the figures and in particular FIG. 4, there is depicted a top view of a computer system 400 having a computer system enclosure 401 which incorporates two vented covers with acoustic noise reduction according to the preferred embodiments of the present invention. Although the preferred embodiments of the present invention are described herein within the context of an enclosure for containing a computer system, those skilled in the art will appreciate that the present invention may be practiced with an enclosure for containing any type of system. For example, the present invention may be practiced with an enclosure for an air treatment system, such as an air filter, air cleaner, dehumidifier, air conditioner, heater, or the like. Likewise, the present invention may be practiced with an enclosure for containing a computer system different than that shown in FIG. 4. For example, the present invention can be applied to enclosures containing computer systems, including personal computers, servers and data storage systems, of various sizes such as small towers (e.g., desktop computer systems), individual rack units and large rack frames (e.g., receiving multiple server units).

As illustrated in FIG. 4, computer system enclosure 401 preferably includes a front panel 402, a rear panel 404, a top panel 406, a bottom panel (not shown), and two side panels 408, 410. However, those skilled in the art will appreciate that computer system enclosure 401 may have any number and configuration of panels. One or more vented covers 412, 414 are also provided according to the preferred embodiments of the present invention. As illustrated, vented covers 412, 414 are respectively mounted at the front and rear of computer system enclosure 401. The vented covers 412, 414 include one or more pair of cross-flow ventilation ducts, which are described in detail below. Vented cover 412 is affixed to computer system enclosure 401 and abuts against front panel 402, which has an airflow aperture 403 therein. Similarly, vented cover 414 is affixed to computer system enclosure 401 and abuts against rear panel 404, which has an airflow aperture 405 therein. The configuration of vented covers 412, 414 shown in FIG. 4 is illustrative, and the present invention is not limited thereto. The vented covers 412, 414 may abut against any panels of the computer system enclosure 401 having airflow apertures therein. For example, vented covers 412, 414 may be respectively mounted at the side and top of computer system enclosure 401. Also, a single vented cover may be used (e.g., an exhaust cover, an intake cover, or a combination exhaust/intake cover), or more than two vented covers may be used.

Figure 5:
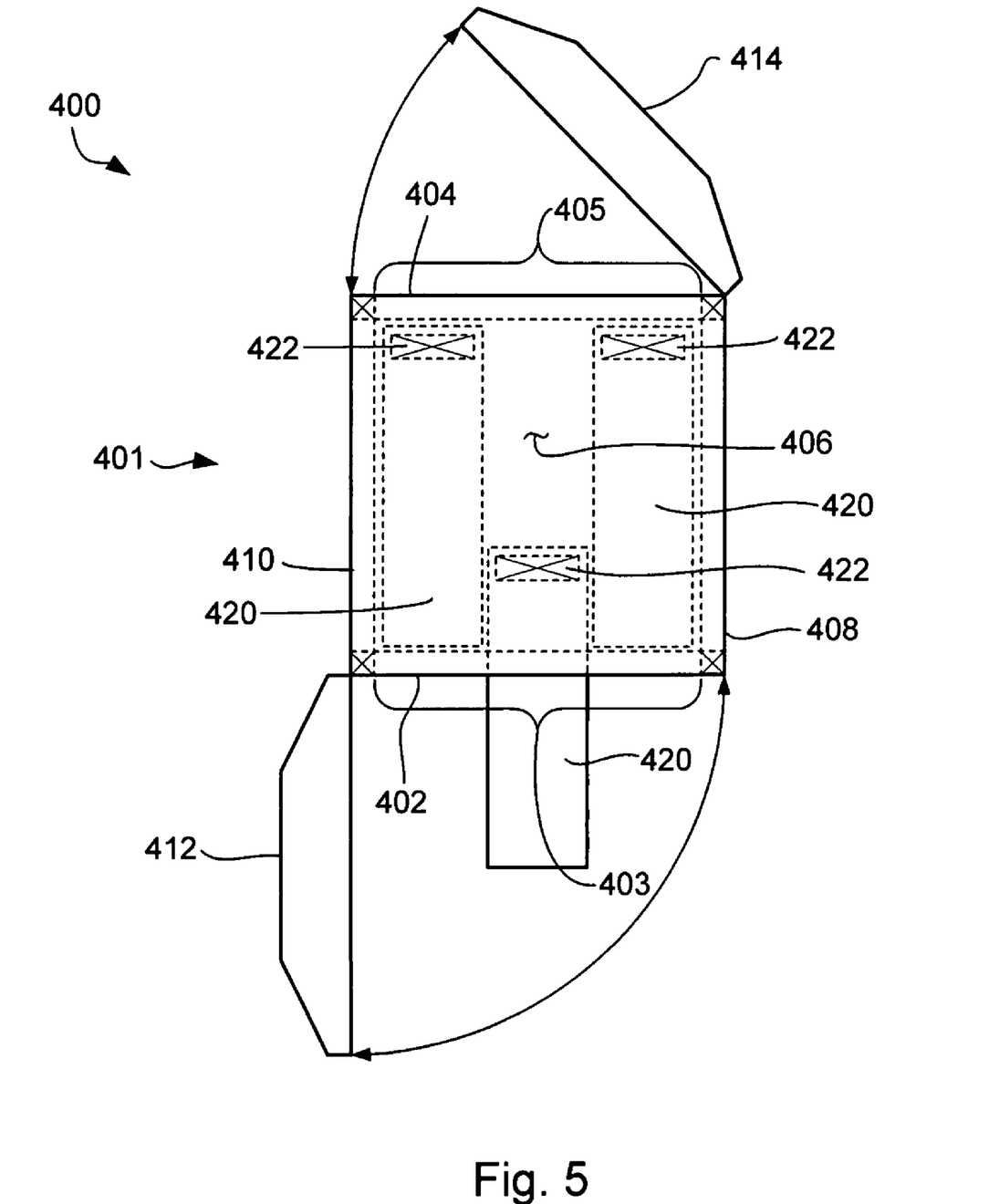
FIG. 5 is a top view of the computer system shown in FIG. 4, with its vented covers open.

The vented covers 412, 414 are preferably affixed to computer system enclosure 401 in a movable or removable manner to allow access to computer system components within computer system enclosure 401. Referring now to FIG. 5, vented covers 412, 414 are preferably hingedly affixed to computer system enclosure 401 to permit access to removable drawers when vented covers 412, 414 are swung open. Alternatively, vented covers 412, 414 may be removably mounted to computer system 401, using fasteners such as bolts, screws, clamps or hangers.

With reference now to both FIGS. 4 and 5, computer system enclosure 401 provides mechanical support for one or more electronic component packages, such as electronics drawers 420. The electronics drawers 420 are used to package processors of computer system 400, along with their associated electronics (e.g., memory, disk drives, power supplies, etc.). Alternatively, the processors of computer system 400 and their associated electronics may be mounted in computer system enclosure 401 without being packaged in electronics drawers. Computer system enclosure 401 further includes at least one air moving device, such as device 422. In computer system enclosures having multiple electronics drawers, one or more moving device 422 may be associated with each electronics drawer 420. Each air moving device 422 may be physically attached to the electronics drawer 420 with which it is associated. Alternatively, air moving devices may be physically attached to computer system enclosure 401. Preferably, electronics drawers 420 are slidably mounted within computer system enclosure 401, providing easy access to the contents of electronics drawers 420 for repair, maintenance, and upgrades. Alternatively, electronics drawers 420 may be permanently mounted within computer system enclosure 401, using fasteners such as bolts, screws or clamps.

Referring to FIG. 4, air moving devices 422 cause ambient air to enter computer system enclosure 401 through one or more pair of intake apertures (not shown in FIG. 4) in front vented cover 412 in the directions shown by the intake arrows designated with reference numeral 432. In other words, in the embodiment shown in FIG. 4 front vented cover 412 is an intake cover. Air then flows over or through electronics drawers 420, where heat is transferred to the air from heat generating components within electronics drawers 420, thereby increasing the temperature of the air as it passes over or through electronics drawers 420. Heated air then exits computer system enclosure 401 through one or more pair of exhaust apertures (not shown in FIG. 4) in rear vented cover 414 in the directions shown by the exhaust arrows designated by reference numeral 434, where it returns to and mixes with room ambient air. In other words, in the embodiment shown in FIG. 4 rear vented cover 414 is an exhaust cover.

Figure 6:
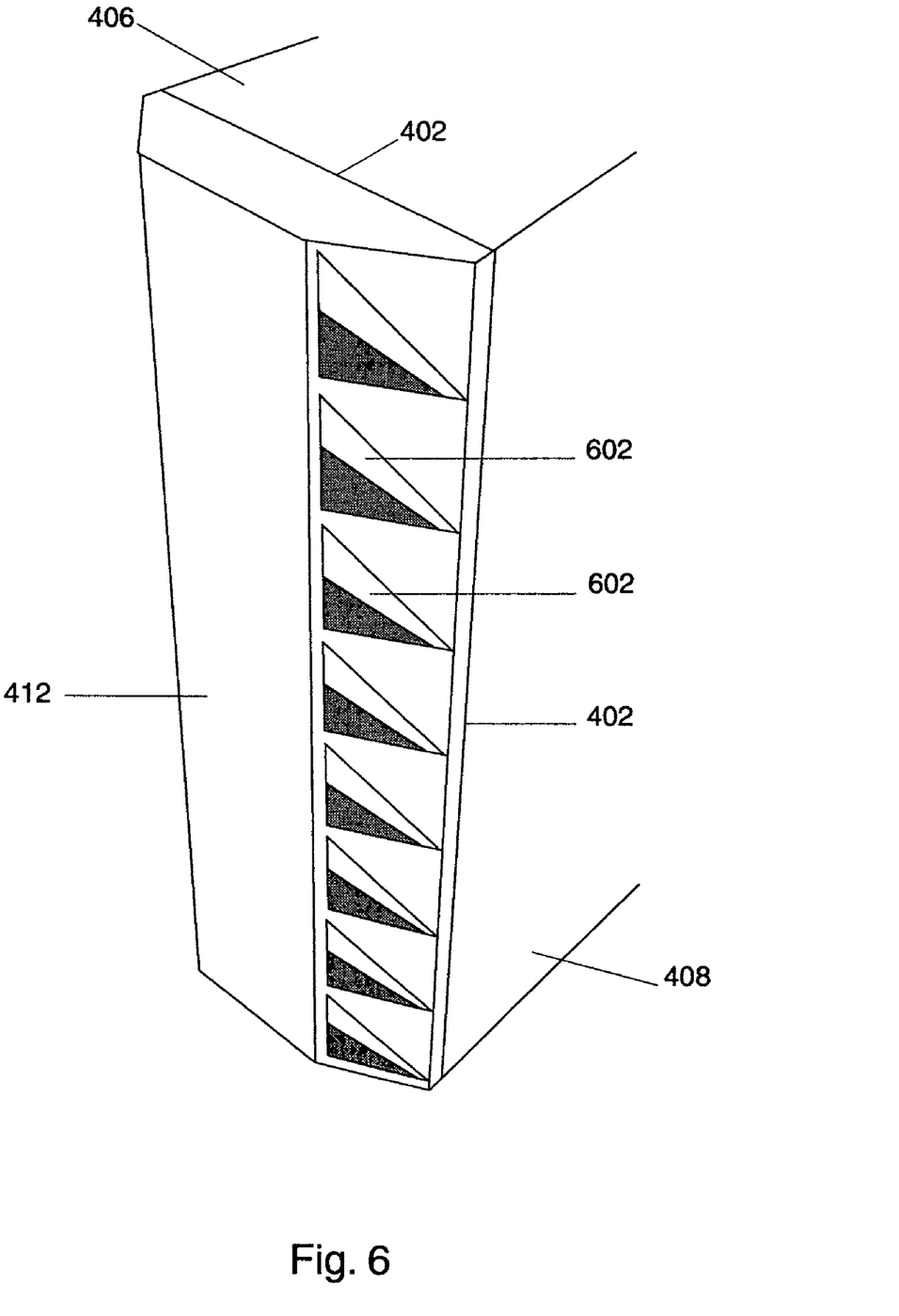
FIG. 6 is a perspective view of the computer system shown in FIG. 4, including a front vented cover (intake cover) having cross-flow ventilation ducts with an acoustic noise reduction lining according to the preferred embodiments of the present invention.

FIG. 6 is a perspective view of computer system enclosure 401 incorporating the front vented cover 412. Air is drawn into computer system enclosure 401 through one or more pair of intake apertures in front vented cover 412. These intake apertures are preferably generally triangular intake apertures, such as the right-side intake apertures 602 shown in FIG. 6. Each right-side intake aperture 602 shown in FIG. 6 defines the intake of one member of a pair of cross-flow ventilation ducts. The left-side intake aperture that defines the intake of the other member of each pair of cross-flow ventilation ducts cannot be seen from the right-side perspective shown in FIG. 6, but is a generally triangular intake aperture on the left side of front vented cover 412 that is substantially identical to and in a complimentary orientation with respect to its mate (i.e., right-side intake aperture 602). In addition, front vented cover 412 is preferably shaped to include right-side and right-side chamfered surfaces where right-side intake aperture 602 and the left-side intake aperture respectively reside at an angle (e.g., 90° or greater) with respect to one another. This allows the cover to hinge open without being impeded by a similar adjacent cover.

Figure 7A:
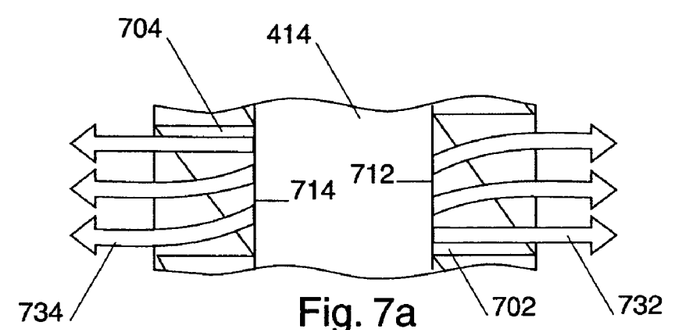
FIGS. 7a-7d are respectively a partial front view; a section, top view; a partial rear view; and a partial side view of a rear vented cover (exhaust cover) having cross-flow ventilation ducts with an acoustic noise reduction lining according to the preferred embodiments of the present invention.
Figure 9A:
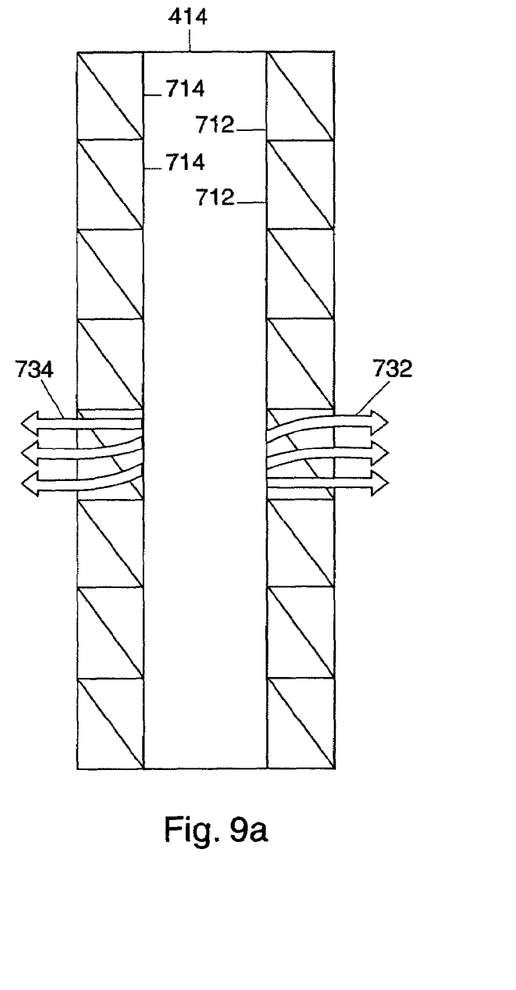
FIGS. 9a-9b are respectively a front view and a top view of the rear vented cover (exhaust cover) shown in FIGS. 8a-8b.
Figure 10:
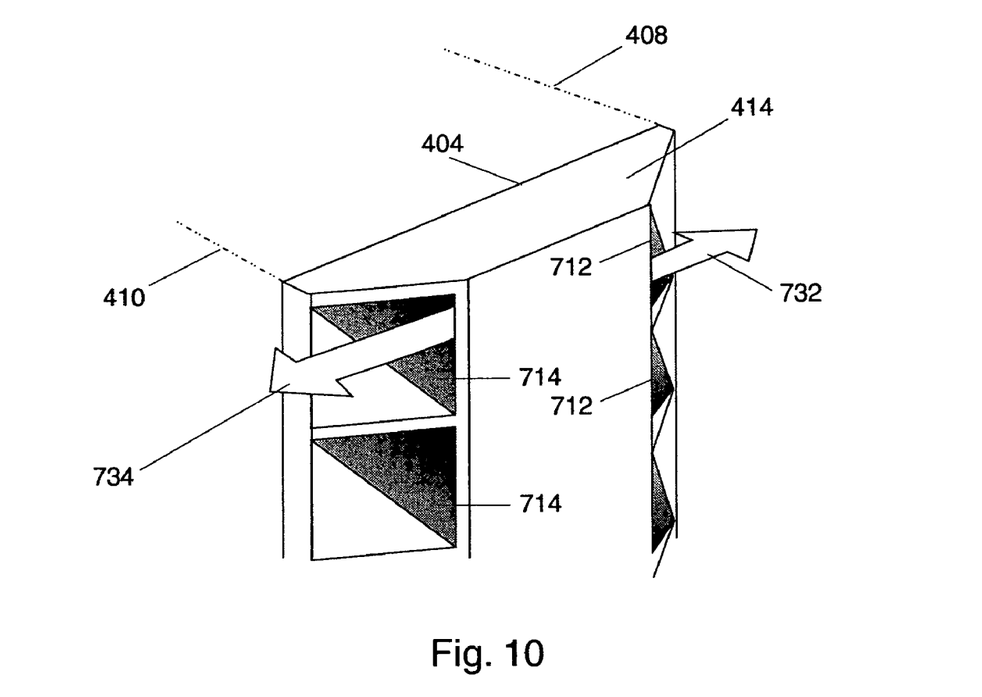
FIG. 10 is a partial, front perspective view of the rear vented cover (exhaust cover) shown in FIGS. 8a-8b.

The configuration and the relative orientation of each pair of intake apertures of front vented cover 412 (i.e., intake cover) can be seen in FIGS. 7a, 9a and 10, which show analogous (preferably identical) exhaust apertures of rear vented cover 414 (i.e., exhaust cover). Although the front vented cover 412 shown in FIG. 6 includes eight pair of cross-flow ventilation ducts (as indicated by the eight right-side intake apertures 602 shown therein), any number of pair of cross-flow ventilation ducts may be used therein according to the preferred embodiments of the present invention. Likewise, although the rear vented cover 414 shown in FIG. 9a includes eight pair of cross-flow ventilation ducts (as indicated by the eight pair of exhaust apertures shown therein), any number of pair of cross-flow ventilation ducts may be used therein according to the preferred embodiments of the present invention.

Preferably, rear vented cover 414 is identical to front vented cover 412 to reduce the number of unique parts used in computer system 400, and hence reduce the cost of producing and maintaining computer system 400. In that case, rear vented cover 414 would include cross-flow ventilations ducts identical to those of front vented cover 412, and include generally triangular exhaust apertures identical to the generally triangular intake apertures in front vented cover 412.

Figure 7B:
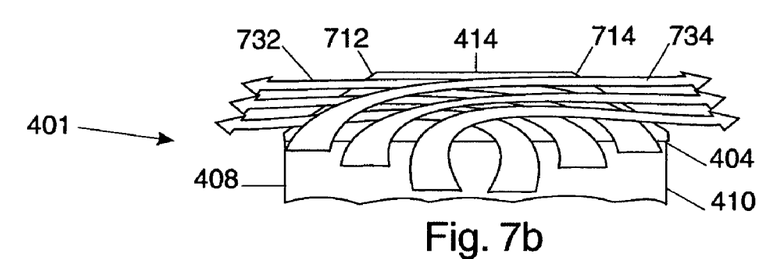

FIGS. 7a-7d are respectively a partial front view; a section, top view; a partial rear view; and a partial side view of rear vented cover 414 (exhaust cover). FIGS. 7e-7g are respectively partial sectional views of rear vented cover 414 along sections A-A, B-B, and C-C in FIG. 7c. FIG. 7b shows rear cover 414 attached to rear panel 404 of computer system 401, while FIGS. 7a and 7c-7g show rear cover 414 isolated from computer system enclosure 401 for the sake of clarity. FIGS. 7a-7g illustrate a single pair of cross-flow ventilation ducts 702/704. As noted above, rear vented cover 414 is preferably identical to front vented cover 412, and hence the description of the rear vented cover 414 (exhaust cover) below also applies to front vented cover 412 (intake cover) although the direction of airflow would be reversed.

Figure 8A:
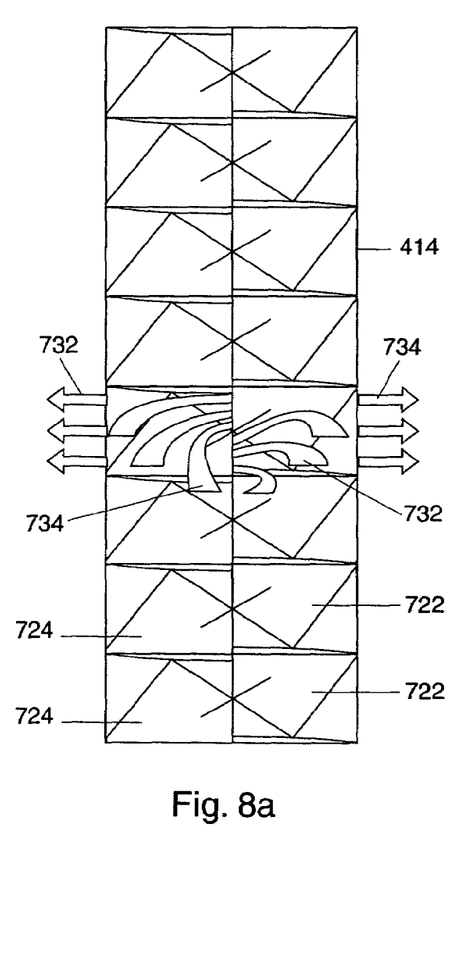
FIGS. 8a-8b are respectively a rear view and a section, top view of a rear vented cover (exhaust cover) of the having cross-flow ventilation ducts with an acoustic noise reduction lining according to the preferred embodiments of the present invention.
Figure 8B:
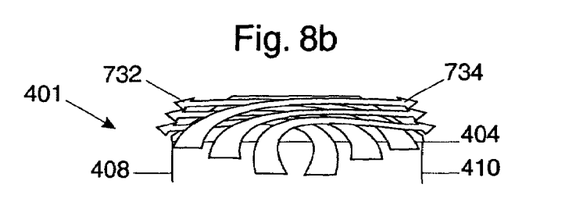
Figure 9B:
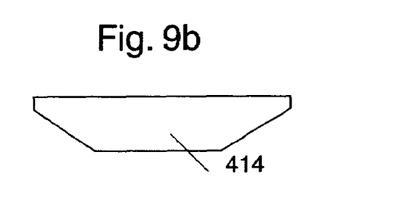
Figure 11:
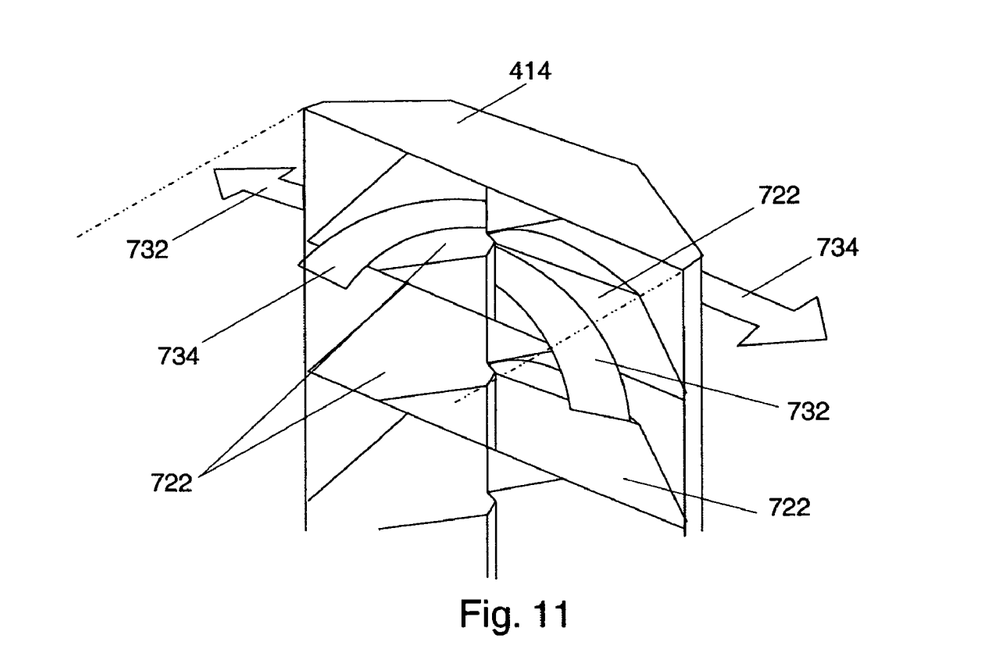
FIG. 11 is a partial, rear perspective view of the rear vented cover (exhaust cover) shown in FIGS. 8a-8b.
Figure 12:
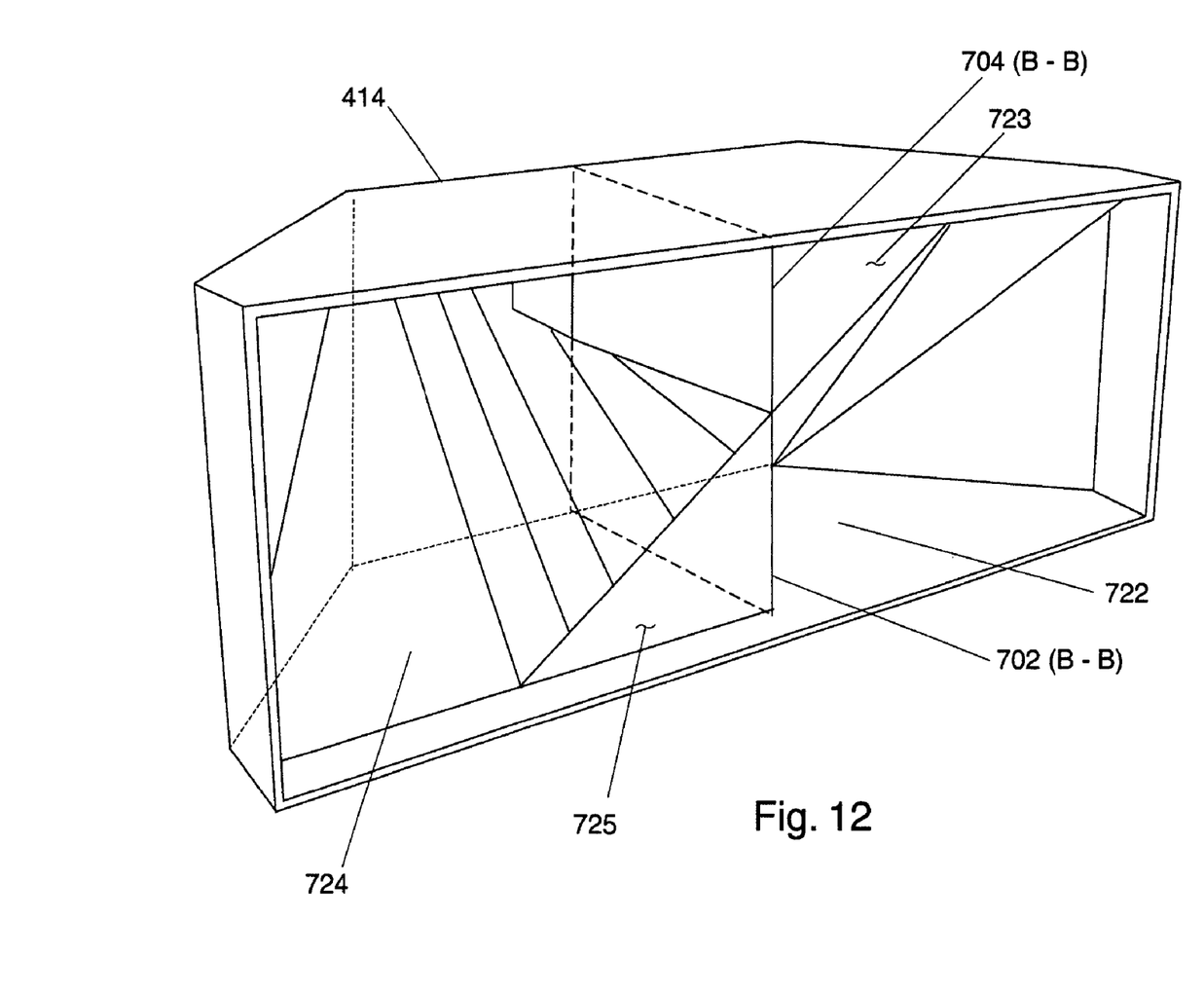
FIG. 12 is an enlarged partial, rear perspective view of one of the pair of cross-flow ventilation ducts of the rear vented cover (exhaust) shown in FIGS. 8a-8b.

FIGS. 8a-8b, 9a-9b, and 10-12 provide additional views of rear vented cover 414 (exhaust cover). FIGS. 8a-8b are respectively a rear view and a section, top view of rear vented cover 414. FIGS. 9a-9b are respectively a front view and a top view of rear vented cover 414. FIG. 10 is a partial, front perspective view of rear vented cover 414. FIG. 11 is a partial, rear perspective view of the rear vented cover 414. FIG. 12 is an enlarged partial, rear perspective view of a single pair of cross-flow ventilation ducts of rear vented cover 414.

Referring now to FIGS. 7a-7d, a lower duct 702 is formed in rear vented cover 414 (exhaust cover) between a generally triangular exhaust aperture 712 and an intake port 722. The intake port 722 occupies substantially one-half (right side from the perspective shown in FIG. 7c) surface area of rear cover 414 where rear vented cover 414 abuts against rear panel 404 of computer system enclosure 401. Intake port 722 is substantially rectangular except for a relatively small, generally triangularly shaped surface 723 (shown in FIG. 7c) at one corner thereof. An upper duct 704 is formed in rear vented cover 414 between a generally triangular exhaust aperture 714 and an intake port 724. The intake port 724, which is coplanar with intake port 722, occupies substantially one-half (left side from the perspective shown in FIG. 7c) surface area of rear cover 414 where rear vented cover 414 abuts against rear panel 404 of computer system enclosure 401. Intake port 724 is substantially rectangular except for a relatively small, generally triangularly shaped surface 725 (shown in FIG. 7c) at one corner thereof. It is important to note that only relatively small, triangular surfaces 723 and 725 block the flow of air near where rear vented cover 414 abuts against rear panel 404 of computer system enclosure 401. Accordingly, airflow is improved relative to conventional vented covers due to reduced surfaces blocking airflow close to the airflow aperture 405 in rear panel 404 through which air exits computer system enclosure 401.

Lower duct 702 and upper duct 704 are "cross-flow" in that they cross and bypass one another. Accordingly, the direction of airflow in lower duct 702 (shown in FIGS. 7a-7g by arrows designated with reference numeral 732) crosses the direction of airflow in upper duct 704 (shown in FIGS. 7a-7g by arrows designated with reference numeral 734). Both lower duct 702 and upper duct 704 include an acoustic noise reduction lining, such as an acoustic foam lining. Examples of acoustic noise reduction lining include open and closed cell, flexible polyurethane, polyimide, melamine and other foams available from Soundcoat Company of Deer Park, N.Y. (These examples are representative of a class of products serving similar functions and do not imply any particular requirement for the specific characteristics of these products.) Preferably, both lower duct 702 and upper duct 704 are lined with an acoustic noise reduction lining in their entirety, i.e., from their intake ports 722, 724 to their exhaust apertures 712, 714. Alternatively, selected portions of lower duct 702 and upper duct 704 may be lined with an acoustic noise reduction lining.

The acoustic noise reduction lining may be, for example, flat, self-adhesive panels that are cut to conform to the surface of the cross-flow ventilation ducts 702, 704 and applied (in tile-like fashion) thereto. Alternatively, the acoustic noise reduction lining may be provided by any other technique known in the art (e.g., cutting, molding, spraying, etc.).

Figure 7C:
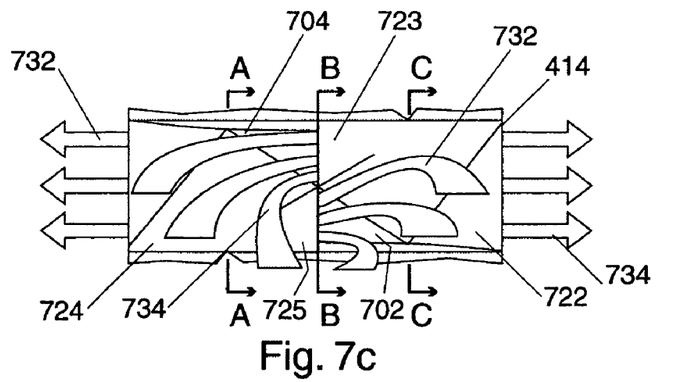
Figure 7D:
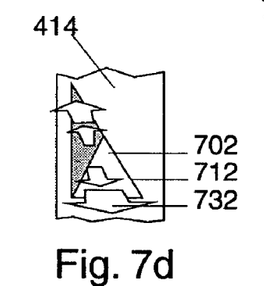
Figure 7E:
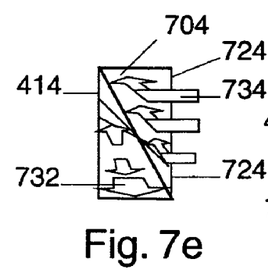
FIGS. 7e-7g are respectively partial sectional views of the rear vented cover (exhaust cover) shown in FIG. 7c along sections A-A, B-B, and C-C.
Figure 7F:
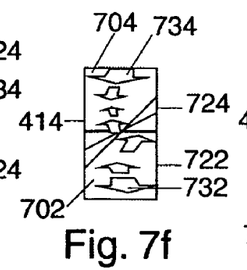
Figure 7G:
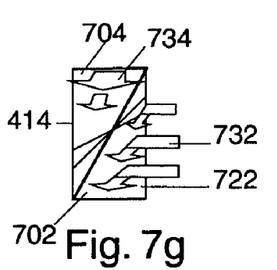

As mentioned above, FIGS. 7e-7g respectively show three parallel partial sectional views of rear vented cover 414 along sections A-A, B-B, and C-C in FIG. 7c. As shown in FIG. 7e, at cross-section A-A lower duct 702 and upper duct 704 are preferably each generally triangular. As shown in FIG. 7f, at cross-section B-B lower duct 702 and upper duct 704 are preferably each generally rectangular. The generally rectangular shape of lower duct 702 and upper duct 704 at cross-section B-B is also shown (as hidden lines) in FIG. 12. As shown in FIG. 7g, at cross-section C-C lower duct 702 and upper duct 704 are preferably each generally triangular.

To reduce airflow resistance, it is preferable to maintain the same cross-sectional area throughout the cross-flow ventilation ducts 702, 704. The area of lower duct 702 remains substantially constant between cross-sections A-A and B-B and between cross-sections B-B and C-C, as does the area of upper duct 704. Additionally, the cross-sectional area of lower duct 702 preferably remains substantially constant (or increases) from cross-section A-A to exhaust aperture 712, while the cross-sectional shape remains generally the same. Likewise, the cross-sectional area of upper duct 704 preferably remains substantially constant (or increases) from cross-section C-C to exhaust aperture 714, while the cross-sectional shape remains generally the same. Similarly, the cross-sectional area of intake port 722 is preferably at least as large as the cross-sectional area of lower duct 702 at cross-section C-C, and the cross-sectional area of intake port 724 is preferably at least as large as the cross-sectional area of upper duct 704 at cross-section A-A. Accordingly, airflow is improved relative to conventional vented covers because air flows substantially unrestricted along the entire path of the cross-flow ventilation ducts 702, 704.

As mentioned above, exhaust apertures 712, 714 are preferably generally triangular. This is preferable to maintain the cross-sectional shape of lower duct 702 from cross-section A-A to exhaust aperture 712, and maintain the cross-sectional shape of upper duct 704 from cross-section C-C to exhaust aperture 714.

In general, it is desirable to avoid tight bends in the cross-flow ventilation ducts to reduce airflow resistance and increase air moving efficiency (otherwise, a larger and/or additional air moving devices may be necessitated). Consequently, the cross-flow ventilation ducts 702, 704 preferably present gently curved surfaces.

Airflow resistance is reduced by reducing surfaces perpendicular and close to where air initially exits through the airflow aperture 405 in rear panel 404. In this regard, only relatively small, triangular surfaces 723 and 725 block airflow where the air initial initially exits through the airflow aperture 405 in rear panel 404, i.e., intake ports 722, 724 occupy substantially the entire area of the airflow aperture 405 in the rear panel 404 where rear vented cover 414 abuts against rear panel 404. Accordingly, airflow is improved relative to conventional vented covers due to reduced surfaces blocking airflow close to the airflow aperture 405 in rear panel 404 through which air exits computer system enclosure 401. For example, in the conventional exhaust covers 220, 320 shown in FIGS. 2 and 3, central acoustic foam block 224 and central acoustic foam panel 324 disadvantageously present large roadblocks to exiting air.

It is also generally desirable for air/noise to stay in the cross-flow ventilation ducts 702, 704 for as long as possible to increase attenuation efficiency. Consequently, the cross-flow ventilation ducts 702, 704 each preferably provide a relatively long air path. This long air path allows the surface area of the sound absorbing material (i.e., the acoustic noise reduction lining) to be increased relative to conventional vented covers, thereby improving acoustic attenuation. The long air path also reduces the "line of sight" to noise sources, which farther improves acoustic attenuation. In this case, "line of sight" means that if you can easily see through the ducts to the other side of the cover, then noise has a similar, easy way out of the cover. Reducing "line of sight" reduces the level of noise that can pass through.

Preferably, in large sizes, rear vented cover 414 includes a metal outer shell into which is/are inserted one or more plastic inserts that provide cross-flow ventilation ducts 702, 704. The outer metal shell could provide electromagnetic interference protection. For smaller applications such as PC tower sizes, the outer shell could be plastic or other nonmetal material. The plastic inserts are preferably made from thermally formed plastic. For example, a flat sheet of plastic may be heated to form the bends (shown in FIG. 12) that define the gently curved surface of cross-flow ventilation ducts 702, 704. Alternatively, one or more metal inserts may be used in lieu of plastic inserts. For example, metal inserts may be formed by working sheet metal using any technique known in the art (e.g., bending, welding, riveting, adhering, etc.). Advantageously, plastic inserts reduce the weight of rear vented cover 414 relative to using metal inserts. Also, it may be desirable to form the insert from an acoustic noise reduction material.

It is important to note that the vented cover according to the preferred embodiments of the present invention has a relatively thin depth because the cross-flow ventilation ducts 702, 704 cross and bypass each other in a very space efficient manner. This contrasts with conventional vented covers, which typically are relatively thick and thereby significantly and disadvantageously increase the footprint of the computer system enclosure to which they are attached.

One skilled in the art will appreciate that many variations are possible within the scope of the present invention. Although the preferred embodiments of the present invention is described herein within the context of an enclosure for containing a computer system, those skilled in the art will appreciate that the present invention may be practiced with an enclosure for containing any type of system. For example, the present invention may be practiced with an enclosure for an air treatment system, such as an air filter, air cleaner, dehumidifier, air conditioner, heater, or the like in lieu of an enclosure containing a computer system. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. A computer system, comprising:
   an electronic component package;
   an enclosure for containing the electronic component package, the enclosure including a front panel, a rear panel, a top panel, a bottom panel, and two side panels;
   an air moving device for passing air through the enclosure;
   a vented cover affixed to the enclosure and abutted against a selected one of the panels having an airflow aperture, the vented cover including a pair of cross-flow ventilation ducts, wherein one of the cross-flow ventilation ducts crosses the other of the cross-flow ventilation ducts, and wherein at least a portion of each of the cross-flow ventilation ducts includes an acoustic noise reduction lining, wherein the vented cover has a first cross-section in which the cross-flow ventilation ducts are generally triangular, a second cross-section in which the cross-flow ventilation ducts are generally rectangular, a third cross-section in which the cross-flow ventilation ducts are generally triangular, and wherein the second cross-section is between and parallel to the first and third cross-sections.

2. The computer system as recited in claim 1, wherein the cross-sectional area of each of the cross-flow ventilation ducts remains substantially constant throughout and between the first, second and third cross-sections.

3. A computer system, comprising:
   an electronic component package;
   an enclosure for containing the electronic component package, the enclosure including a front panel, a rear panel, a top panel, a bottom panel, and two side panels;
   an air moving device for passing air through the enclosure;
   a vented cover affixed to the enclosure and abutted against a selected one of the panels having an airflow aperture, the vented cover including a pair of cross-flow ventilation ducts, wherein one of the cross-flow ventilation ducts crosses the other of the cross-flow ventilation ducts, and wherein at least a portion of each of the cross-flow ventilation ducts includes an acoustic noise reduction lining, wherein a first one of the cross-flow ventilation ducts has an intake port that is generally coplanar with an intake port a second one of the cross-flow ventilation ducts, and wherein the first one of the cross-flow ventilation ducts has an exhaust aperture that is at an angle with respect to an exhaust aperture of the second one of the cross-flow ventilation ducts.

4. The computer system as recited in claim 3, wherein the exhaust aperture of the first one of the cross-flow ventilation ducts is generally triangular and the exhaust aperture of the second one of the cross-flow ventilation ducts is generally triangular and in a complementary orientation with respect to the generally triangular exhaust aperture of the first one of the cross-flow ventilation ducts.

5. A computer system, comprising:
an electronic component package;
an enclosure for containing the electronic component package, the enclosure including a front panel, a rear panel, a top panel, a bottom panel, and two side panels;
an air moving device for passing air through the enclosure;
a vented cover affixed to the enclosure and abutted against a selected one of the panels having an airflow aperture, the vented cover including a pair of cross-flow ventilation ducts, wherein one of the cross-flow ventilation ducts crosses the other of the cross-flow ventilation ducts, and wherein at least a portion of each of the cross-flow ventilation ducts includes an acoustic noise reduction lining, wherein a first one of the cross-flow ventilation ducts has an exhaust port that is generally coplanar with an exhaust port a second one of the cross-flow ventilation ducts, and wherein the first one of the cross-flow ventilation ducts has an intake aperture that is at an angle with respect to an intake aperture of the second one of the cross-flow ventilation ducts.

6. The computer system as recited in claim 5, wherein the intake aperture of the first one of the cross-flow ventilation ducts is generally triangular and the intake aperture of the second one of the cross-flow ventilation ducts is generally triangular and in a complementary orientation with respect to the generally triangular intake aperture of the first one of the cross-flow ventilation ducts.

* * * * *